(12) United States Patent
Shih

(10) Patent No.: US 7,732,264 B2
(45) Date of Patent: Jun. 8, 2010

(54) FABRICATION METHODS OF THIN FILM TRANSISTOR SUBSTRATES

(75) Inventor: Chih-Hung Shih, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 112 days.

(21) Appl. No.: 11/869,225

(22) Filed: Oct. 9, 2007

(65) Prior Publication Data

US 2008/0227252 A1   Sep. 18, 2008

(30) Foreign Application Priority Data

Mar. 13, 2007   (TW) .............................. 96108579 A

(51) Int. Cl.
*H01L 21/00*   (2006.01)
*H01L 31/00*   (2006.01)

(52) U.S. Cl. ........................ 438/158; 438/149; 438/940; 257/E21.414; 257/60; 257/E51.005; 257/E29.151; 257/E29.294

(58) Field of Classification Search ......... 438/151–156, 438/627, 678, 940, 144, 149, 158; 257/57, 257/E21.411–E21.414, 59, 60, E51.005, 257/E29.273, E29.294, E21.412
See application file for complete search history.

(56) References Cited

U.S. PATENT DOCUMENTS

2005/0041166 A1*   2/2005   Yamazaki et al. ............. 349/42
2007/0269937 A1*   11/2007   Lin .............................. 438/149

\* cited by examiner

*Primary Examiner*—Ha Tran T Nguyen
*Assistant Examiner*—Aaron A Dehne
(74) *Attorney, Agent, or Firm*—Thomas, Kayden, Horstemeyer & Risley

(57) ABSTRACT

Methods for manufacturing thin film transistor arrays utilizing three steps of lithography and one step of laser ablation while the lithography procedure is used four to five times in conventional processes are disclosed. The use of the disclosed methods assists in improving throughput and saving of manufacturing cost.

12 Claims, 32 Drawing Sheets

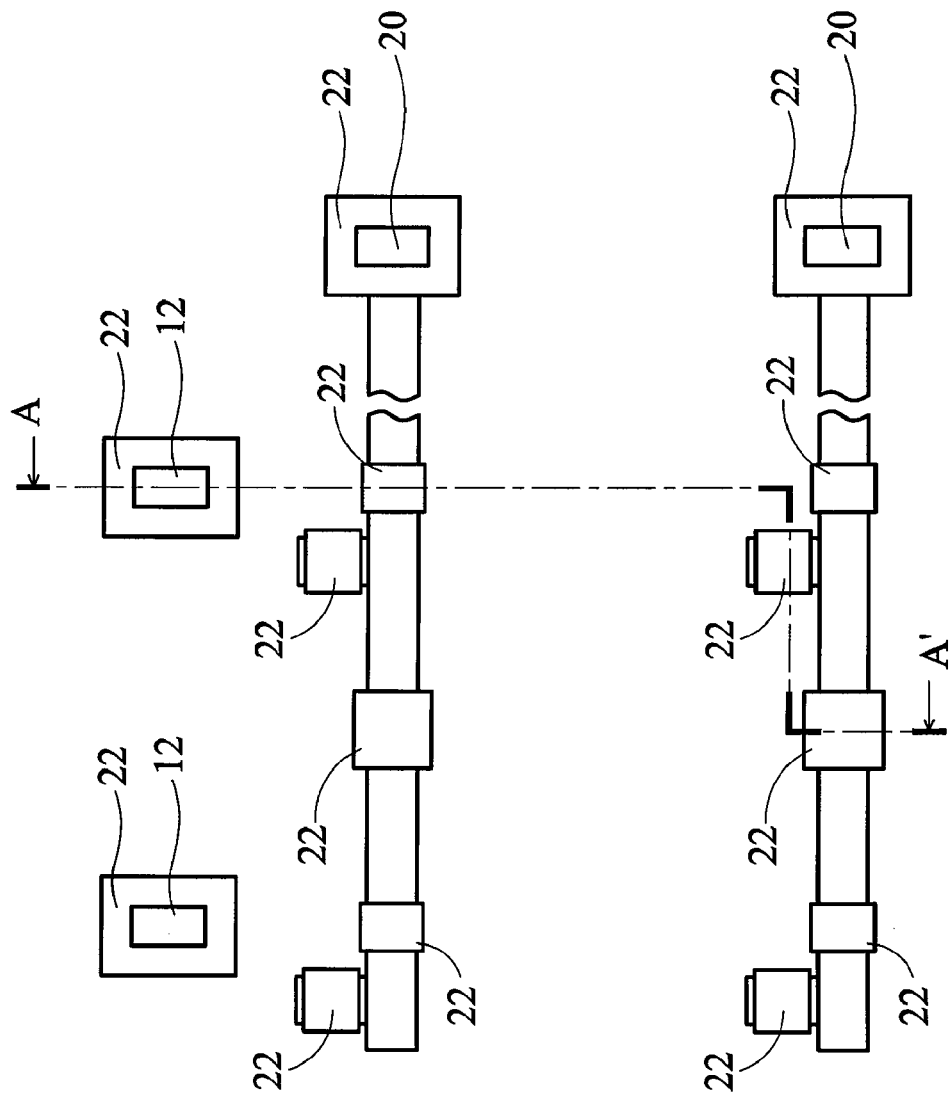

FABRICATION METHODS OF THIN FILM TRANSISTOR SUBSTRATES

BACKGROUND OF THE INVENTION

1. Field of the Invention

The present invention relates to a fabrication method of a thin film transistor (TFT) array substrate, and in particular relates to a fabrication method of a TFT array substrate using only a three-mask (hereinafter, mask also refers to photomask) process and one laser ablation process.

2. Description of the Related Art

For conventional fabrication methods, a thin film transistor array substrate used in liquid crystal displays is typically manufactured utilizing a four- or five-mask process with relatively higher manufacturing costs. A four-mask process used to manufacture thin film transistor array substrates used in liquid crystal displays includes: a first mask process to form gate electrodes and the lower electrodes of capacitors; a second mask process to form gate dielectric layers, semiconductor layers, ohmic contact layers, data lines, and source and drain regions; a third mask process to form passivation layer and via hole; and a fourth mask process to form pixel electrode and the upper electrodes of capacitors.

To improve throughput and reduce manufacturing costs, a fabrication method for a thin film transistor array substrate with decreased processing complexity is desirable.

BRIEF SUMMARY OF THE INVENTION

Embodiments of the invention disclose a fabrication method for a thin film transistor array substrate, using only a three-mask process and one laser ablation process to form a thin film transistor array.

In one embodiment, a fabrication method for a thin film transistor (TFT) array substrate is provided. The method comprises: forming a first conductive layer on a substrate; performing a first mask process to pattern the first conductive layer, thereby forming a contact pad, a gate line, a gate electrode and a lower electrode of a capacitor; forming a stack covering the substrate, the contact pad, the gate line, the gate electrode and the lower electrode of the capacitor, wherein the stack includes a gate dielectric layer, a semiconductor layer and an ohmic contact layer; performing a second mask process to pattern the stack, thereby exposing the substrate and forming a first opening exposing the contact pad; forming a first transparent conductive layer covering the substrate, the stack and the exposed contact pad; forming a second transparent conductive layer covering the first transparent conductive layer; performing a third mask process to form a data line perpendicular to the gate line, source and drain regions overlying the gate electrode, a pixel electrode in a pixel area of the substrate, an upper electrode of the capacitor overlying the lower electrode of the capacitor, a contact pad electrode overlying the contact pad, and a second opening exposing the semiconductor layer and separating the source and drain regions, wherein the drain region is electrically connected to the pixel electrode, the source region is electrically connected to the data line, and the upper electrode of the capacitor is electrically connected to the pixel electrode; forming a passivation layer covering the overall substrate; and performing a laser ablation to pattern the passivation layer, thereby forming third and fourth openings exposing the pixel electrode and the contact pad electrode.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIRST EMBODIMENT

Figure 1A:
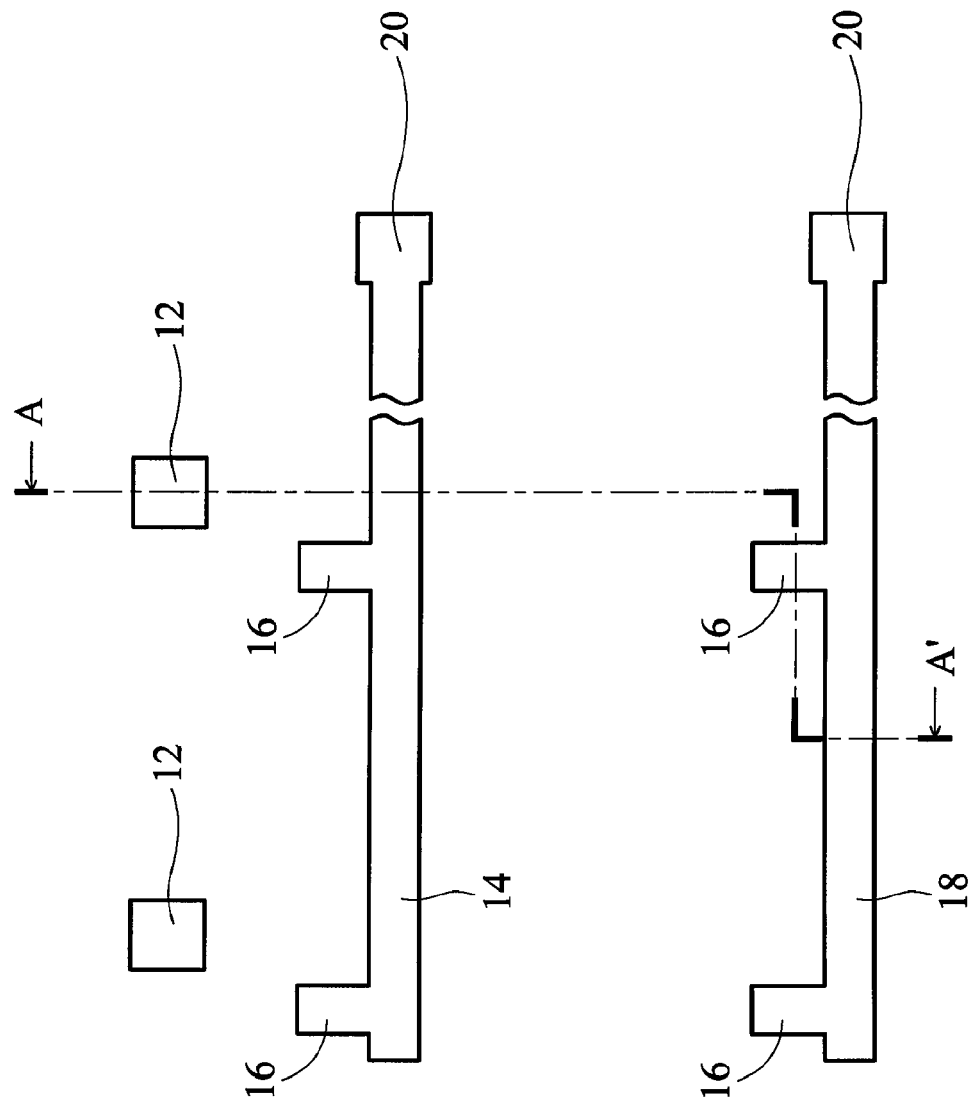
FIGS. 1A~1O illustrate one embodiment of a fabrication method of a thin film transistor (TFT) array substrate.
Figure 1B:
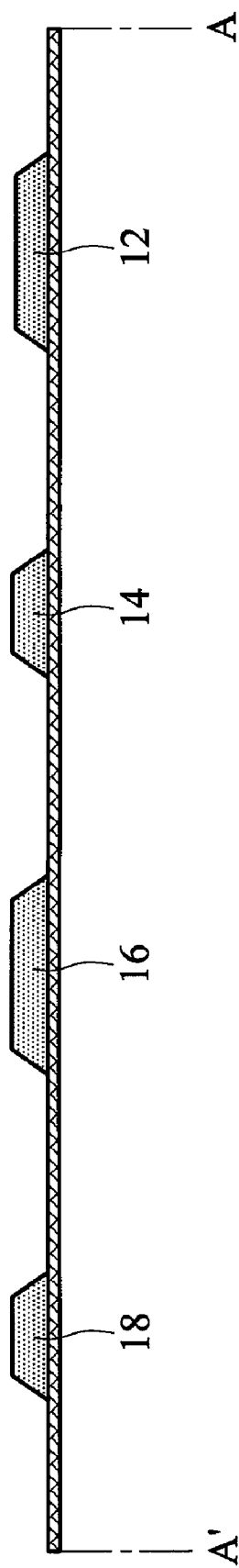

FIGS. 1A~1O illustrate the first embodiment of a fabrication method of a thin film transistor (TFT) array substrate. FIG. 1A shows a plan view of a structure formed by a first mask process and FIG. 1B shows a cross section of FIG. 1A along cross section line AA'. As shown in FIGS. 1A and 1B, a conductive layer (not shown) is formed overlying a substrate (not shown), and is subjected to a first mask process to form a conductive pattern. The conductive pattern includes a lower electrode 18 of a capacitor, a gate 16, a gate line 14, a data line contact pad 12, and a gate line contact pad 20. Materials of the conductive pattern include metal such as Cu, Al, Mo, Ti, or Cr. Formation of the conductive pattern is well known, thus, it is omitted here for brevity. The lower electrode 18 of the capacitor is a part of the gate line 14, and the gate electrode 16 extends from the gate line 14.

Figure 1D:
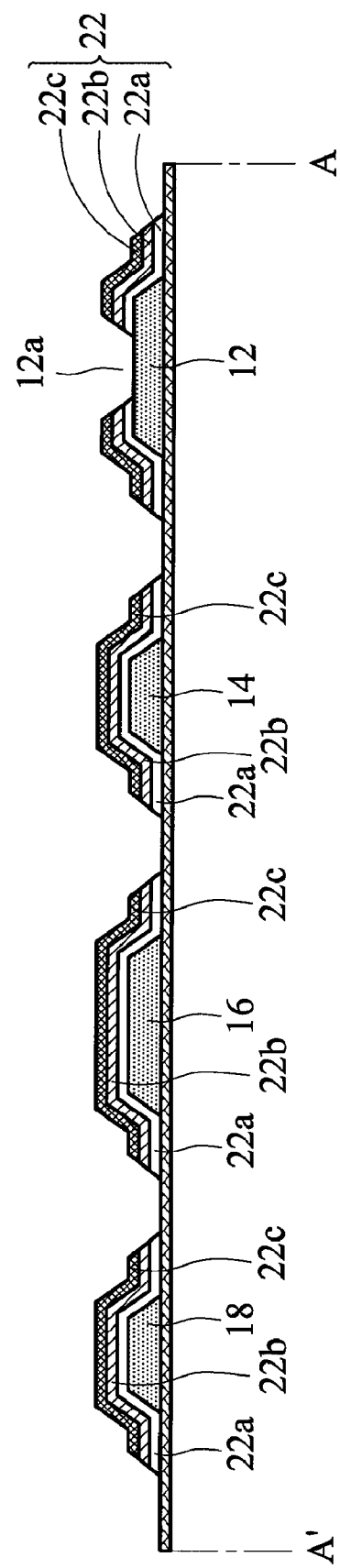

FIG. 1C shows a plan view of a structure formed by a second mask process; FIG. 1D shows a cross section of FIG. 1C along cross section line AA'. As shown in FIGS. 1C and 1D, a stack (not shown) is formed overlying the lower electrode 18 of the capacitor, gate 16, gate line 14, data line contact pad 12, and gate line contact pad 20, and is subjected to a second mask process to form a stack pattern 22, simultaneously, a portion of the substrate is exposed and an opening 12a exposing a portion of the data line contact pad 12 is formed. The stack pattern 22 includes a gate dielectric layer 22a, a semiconductor layer 22b and an ohmic contact layer 22c. Materials of the semiconductor layer 22b can be amorphous silicon or polysilicon. Materials of the gate dielectric layer 22a includes silicon nitride, silicon oxide or silicon oxynitride. Since materials and formation of the stack are well known, the descriptions are omitted here for brevity. It is noted that the gate dielectric layer 22a overlying the gate electrode 16 extends to the surface of the substrate, i.e. fully covering the gate electrode 16.

Figure 1E:
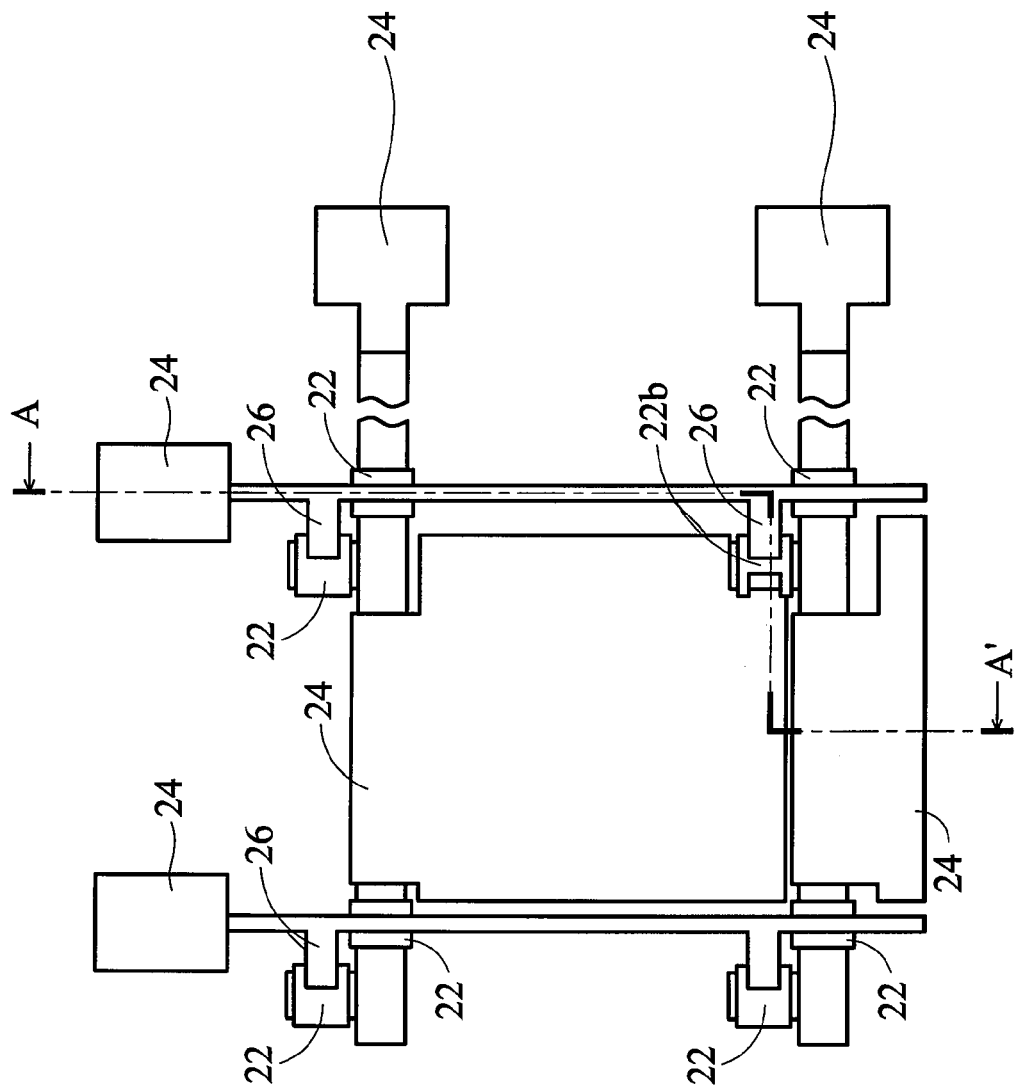
Figure 1F:
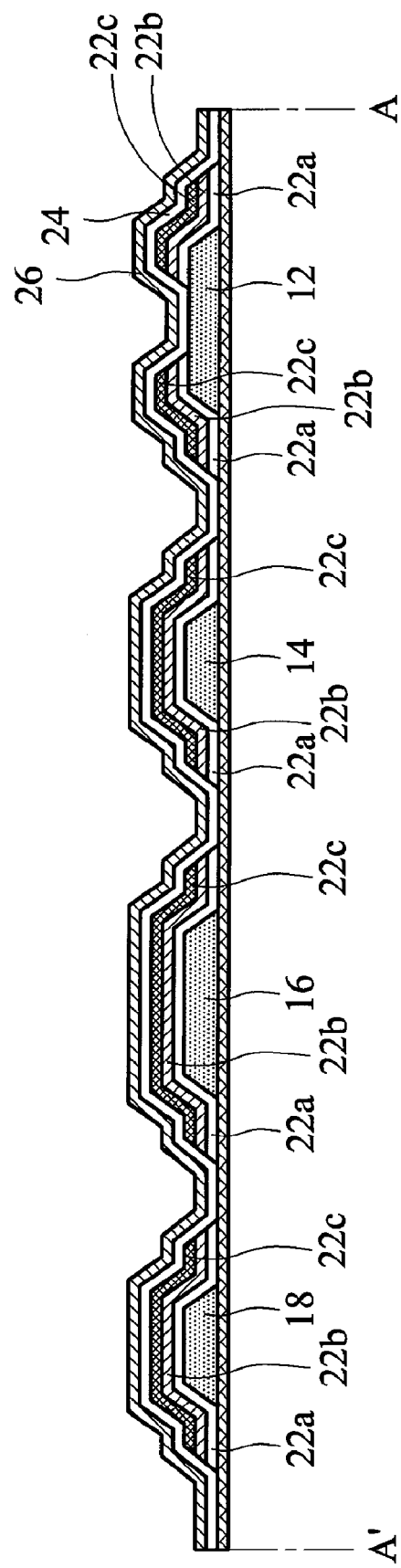
Figure 1G:
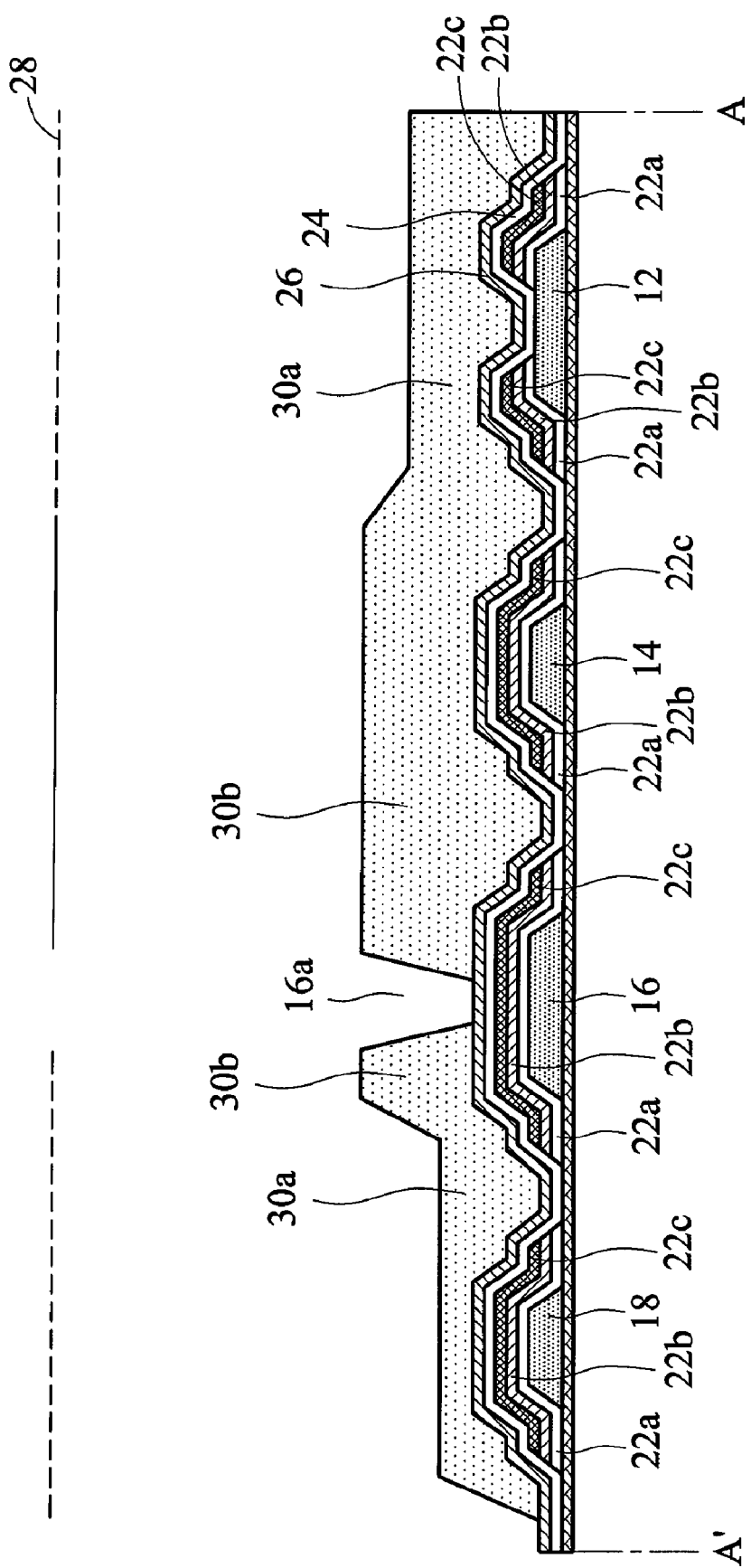

FIG. 1E shows a plan view of a structure formed by a third mask process; FIG. 1F shows a cross section of FIG. 1E along cross section line AA'. As shown in FIG. 1F, a transparent conductive layer 24 and a metal layer 26 are formed in sequence overlying the substrate and the patterned stack. The transparent conductive layer 24 can be an indium tin oxide layer, or an indium zinc oxide layer and, the metal layer 26 can be Cu, Al, Mo, Ti, or Cr; formation thereof is omitted for brevity since it is well known in the art. A photo-resist layer (not shown) is then formed overlying the metal layer 26. As shown in FIG. 1G, a third mask process employing a half-tone mask pattern 28, resulting in formation of a first photo-resist pattern 30a, a second photo-resist pattern 30b and an opening 16a for exposing a portion of the metal layer 26 is proceeded. The second photo-resist pattern 30b is thicker than the first photo-resist pattern 30a. Specifically, the second photo-resist pattern 30b has a thickness which is at least 1.5 times that of the photo-resist pattern 30a.

Figure 1H:
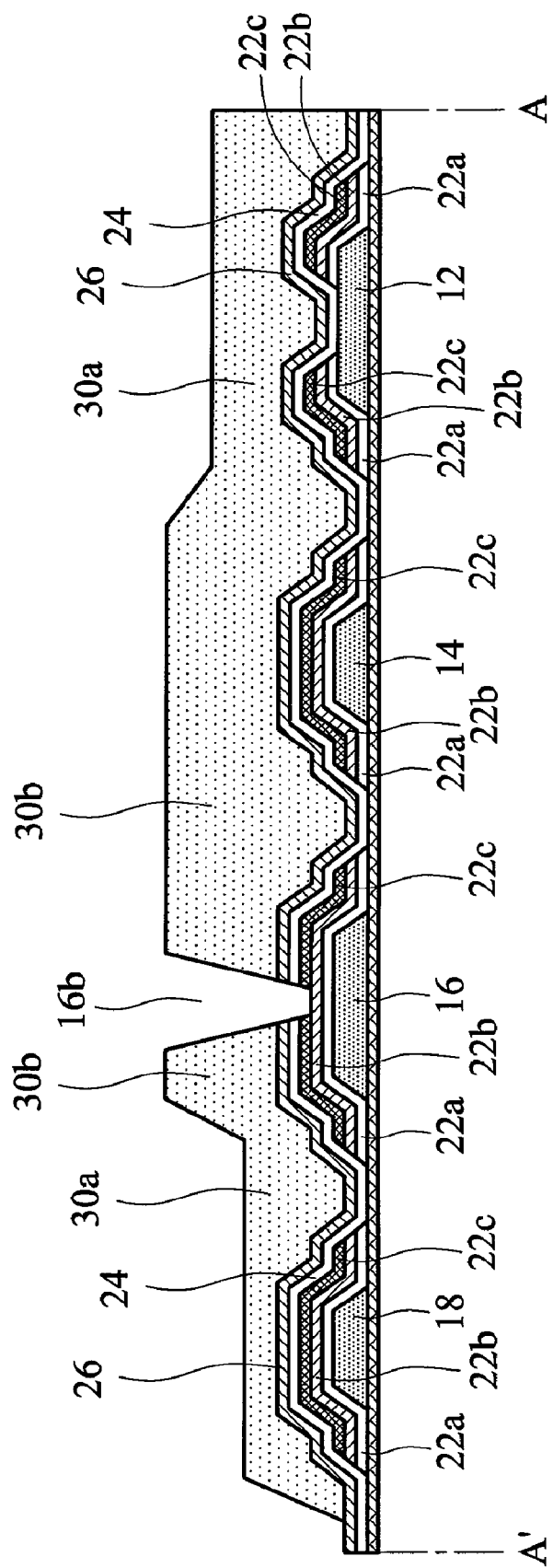
Figure 1I:
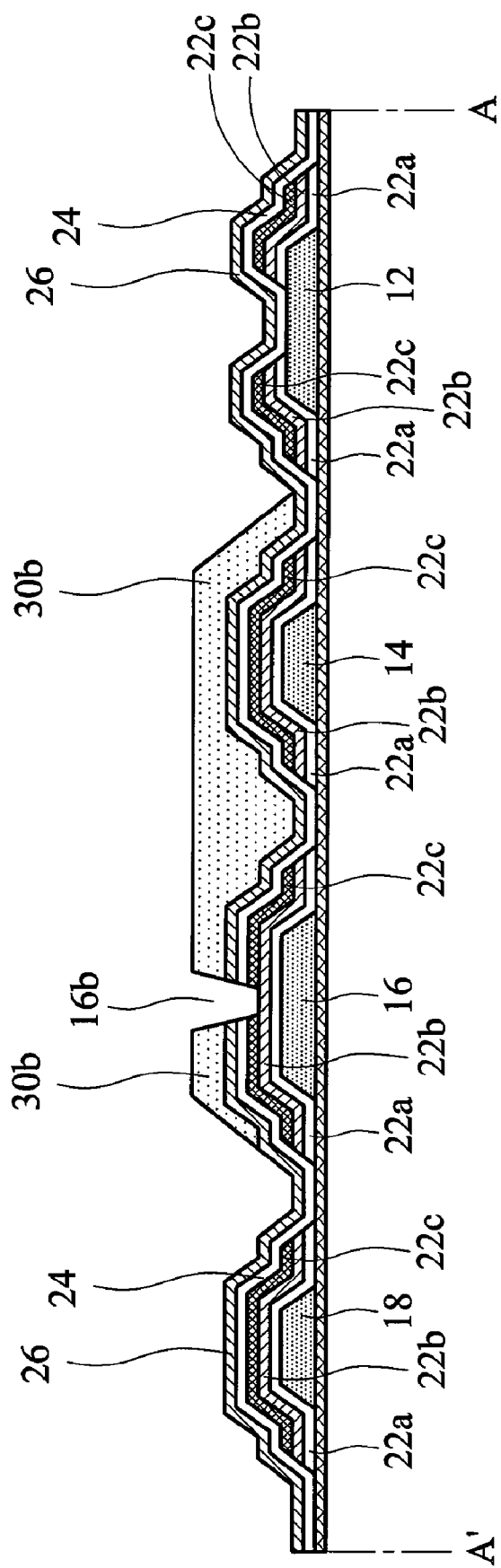

As shown in FIG. 1H, the transparent conductive layer 24, the metal layer 26 and the ohmic contact layer 22c underlying the opening 16a are next etched with the first photo-resist pattern 30a and the second photo-resist pattern 30b serving as masks, while also forming opening 16b. The opening 16b exposes a portion of the semiconductor layer 22b overlying the gate electrode 16. As shown in FIG. 1I, the first photo-resist pattern 30a and the second photo-resist pattern 30b are then etched until complete removal of the first photo-resist pattern 30a. Since the second photo-resist pattern 30b is thicker than the first photo-resist pattern 30a, a portion of the second photo-resist pattern 30b remains.

Figure 1J:
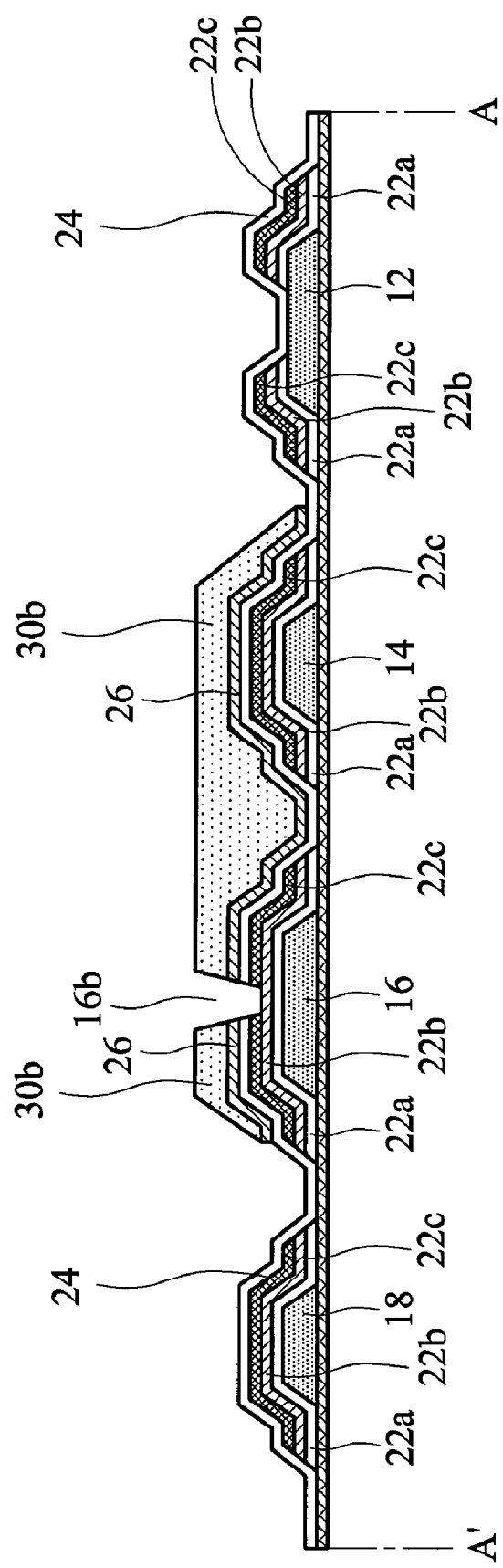
Figure 1K:
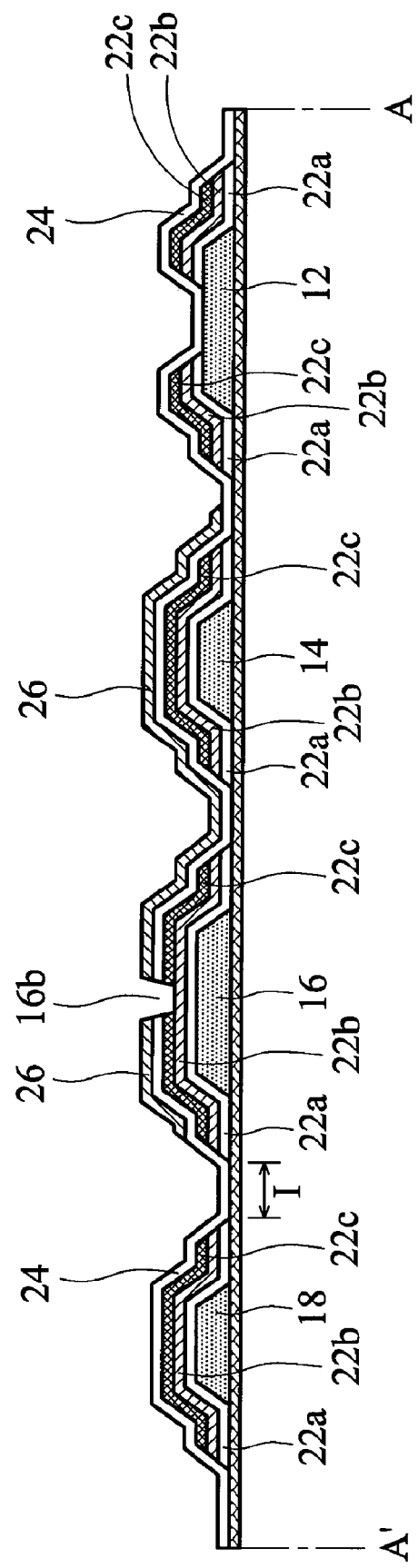

As shown in FIG. 1J, with the remaining second photo-resist pattern 30b over the gate electrode 16 and the gate line 14 serving as masks, the metal layer 26 overlying the lower electrode 18 of the capacitor, the data contact pad 12 and the pixel area I is removed. Referring to FIG. 1K, the second photo-resist pattern 30b overlying the gate electrode 16 and the gate line 14 is stripped. As described, after the third mask process, the remaining metal layer 26 serves as a data line perpendicular to the gate line 14, and source and drain regions (also source and drain electrodes) are isolated by the opening 16b. Additionally, the remaining transparent conductive layer 24 serves as a pixel electrode overlying the pixel area I, an upper electrode of the capacitor overly the lower electrode 18 of the capacitor, and a contact pad electrode overly the data line contact pad 12. Meanwhile, the drain region is electrically connected to the pixel electrode, the source region is electrically connected to the data line, and the upper electrode of the capacitor is electrically connected to the pixel electrode.

Figure 1L:
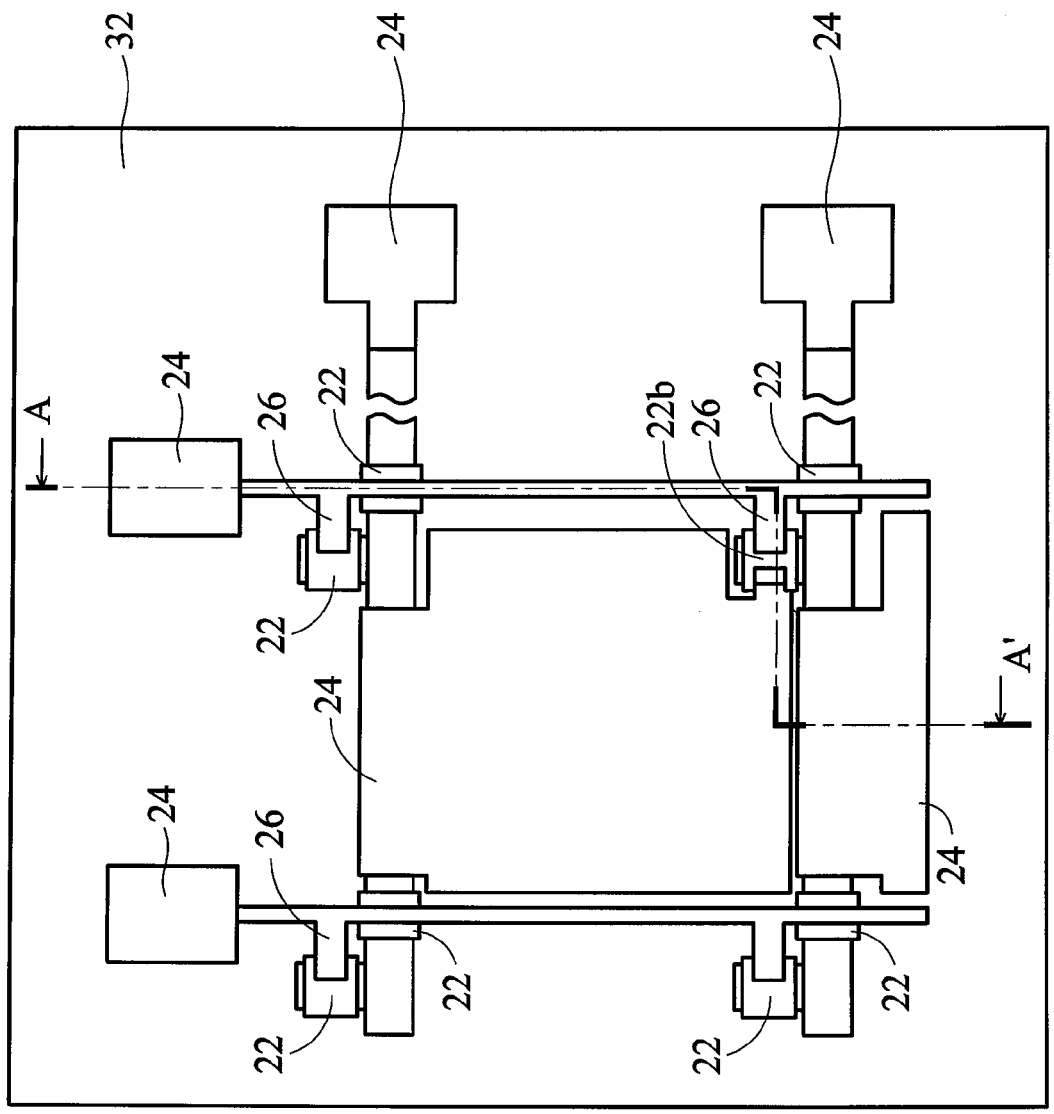
Figure 1M:
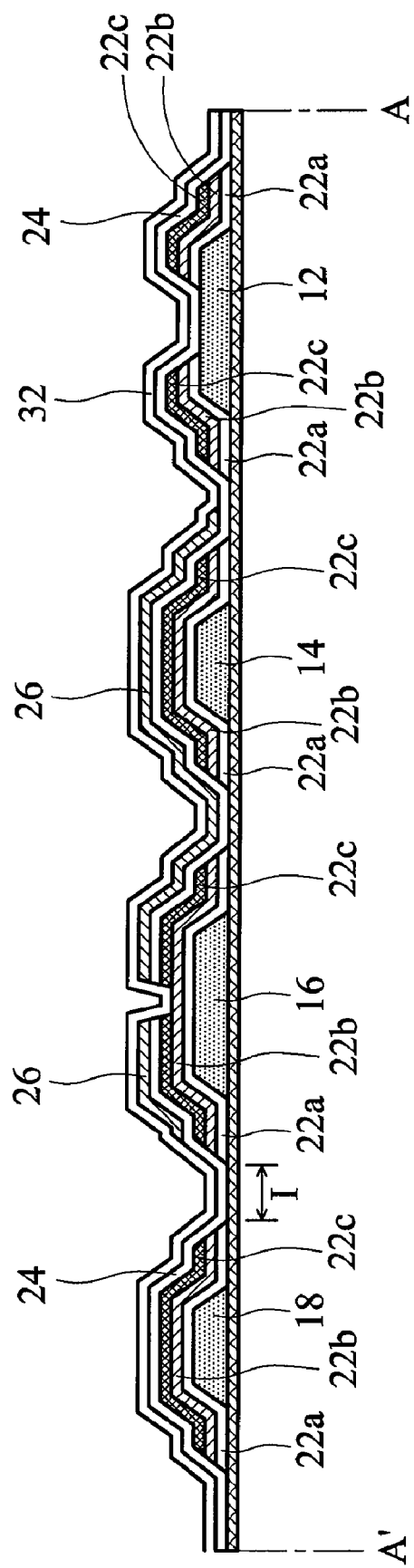
Figure 1N:
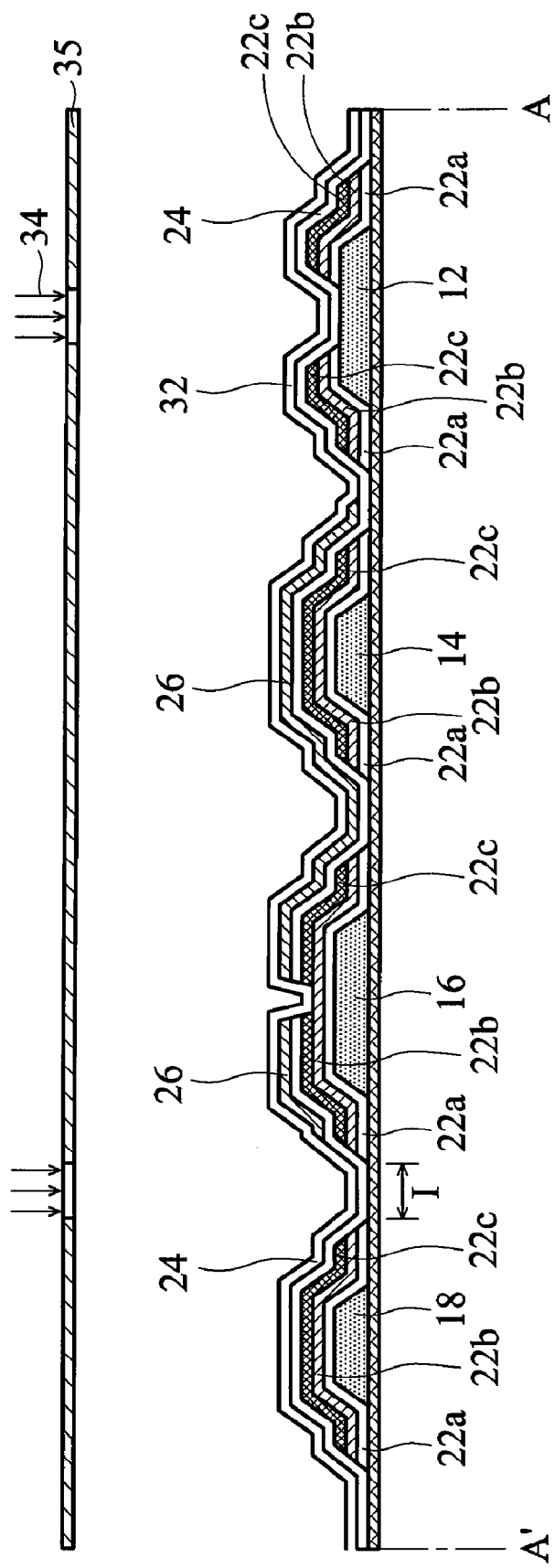
Figure 10:
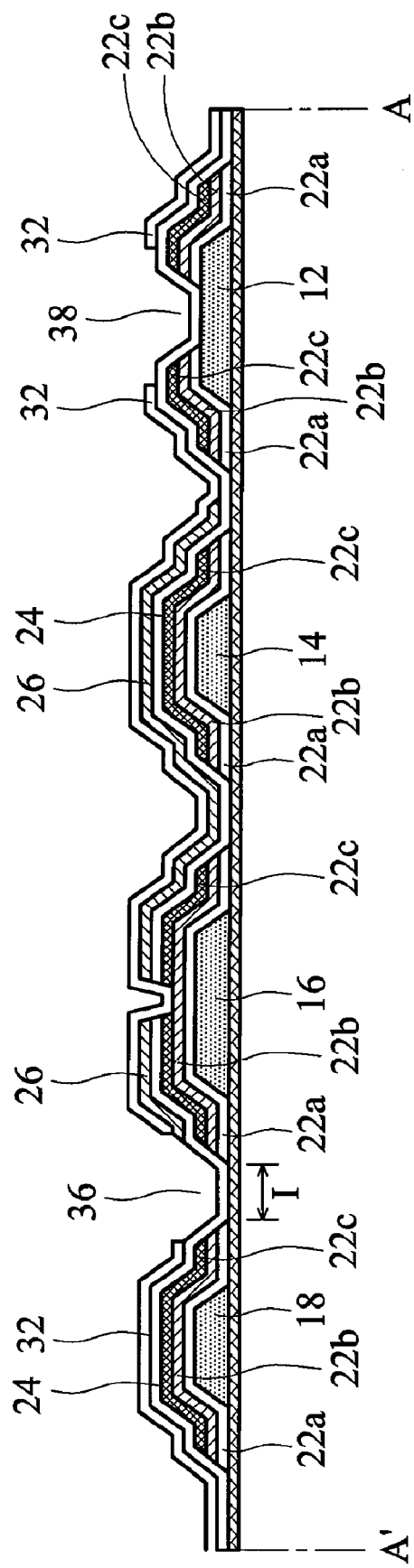

FIG. 1L shows a plan view of a structure formed by a laser ablation process and FIG. 1O shows a cross section of FIG. 1L along cross section line AA'. As shown in FIGS. 1L and 1M, a passivation layer 32 is formed to cover the overall substrate. As shown in FIGS. 1N and 1O, a laser ablation process is then used to pattern the passivation layer 32, thus, forming openings 36 and 38 for exposing the pixel electrode and the data line contact pad 12. In the laser ablation process, a portion of the passivation layer 32 is removed as a laser beam 34 is utilized to pass through a mask pattern 35 directly. In other embodiments (not shown), the previously described removal step can be performed employing conventional mask processes, that is, a photo-resist pattern serving as a mask will be formed on the passivation layer first, and it exposes a portion of the passivation layer overlying the contact pad electrode and the pixel electrode, and the portion of the passivation layer overlying the contact pad electrode and the pixel electrode will be removed using a laser beam prior to removal of the photo-resist pattern. The passivation layer 32 includes silicon nitride, silicon oxide or silicon oxynitride, or organic material containing dielectric layers.

SECOND EMBODIMENT

Figure 2A:
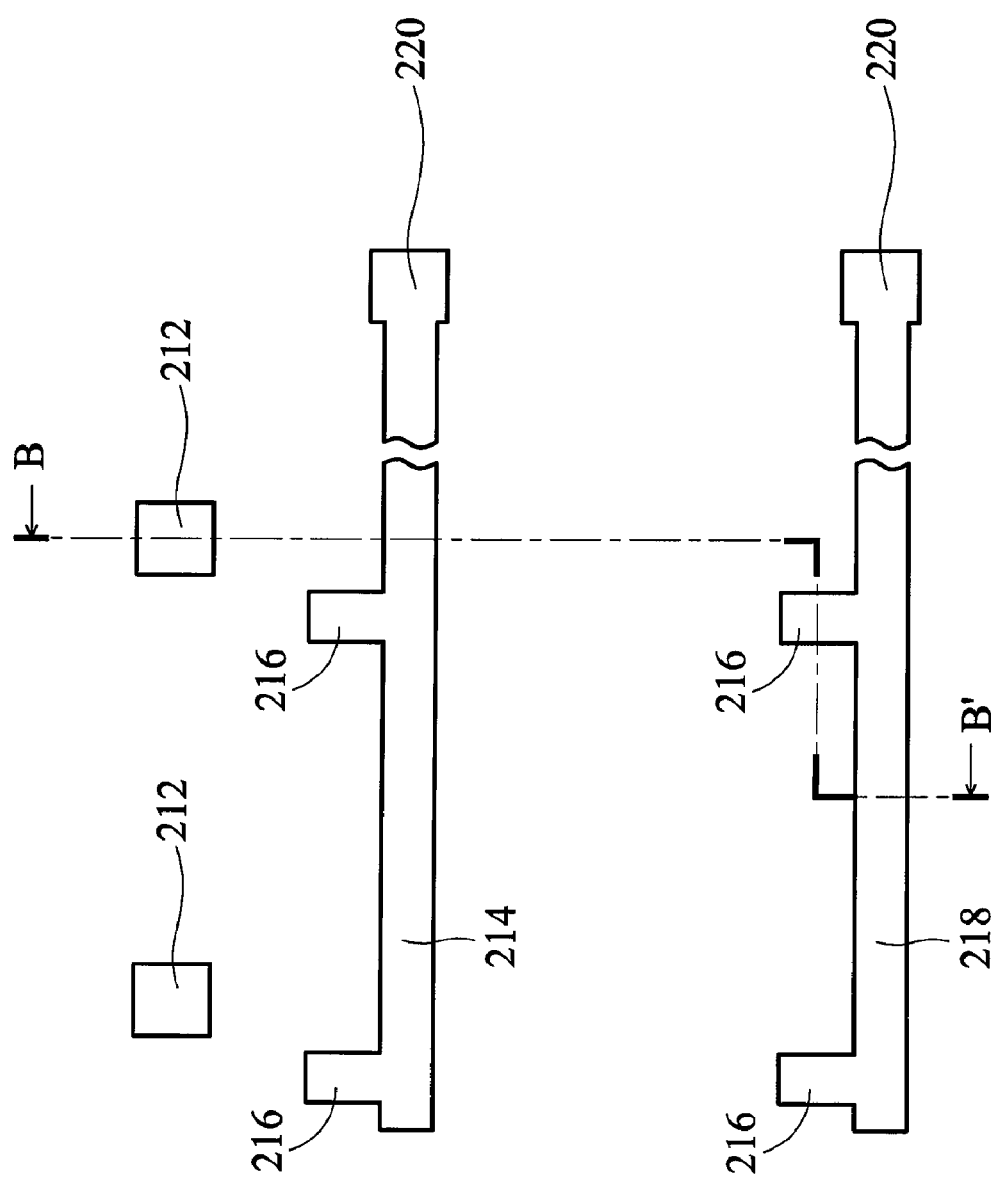
FIGS. 2A~2Q illustrate another embodiment of a fabrication method of a thin film transistor (TFT) array substrate.
Figure 2B:
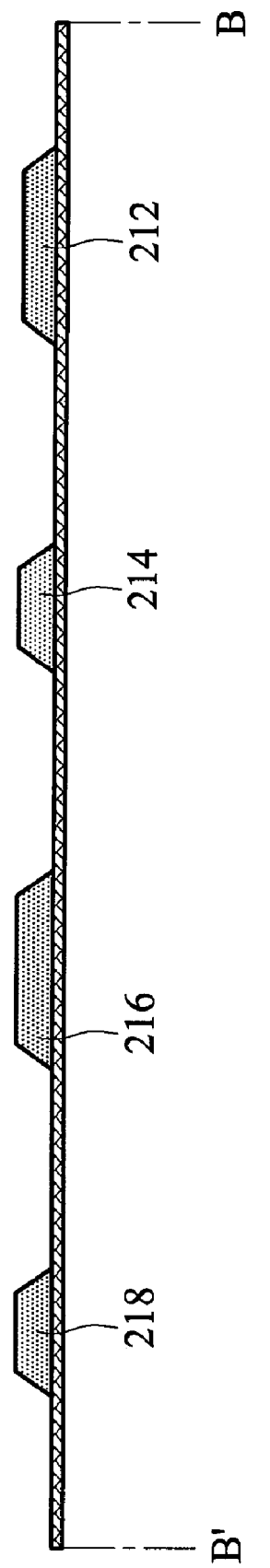
Figure 2C:
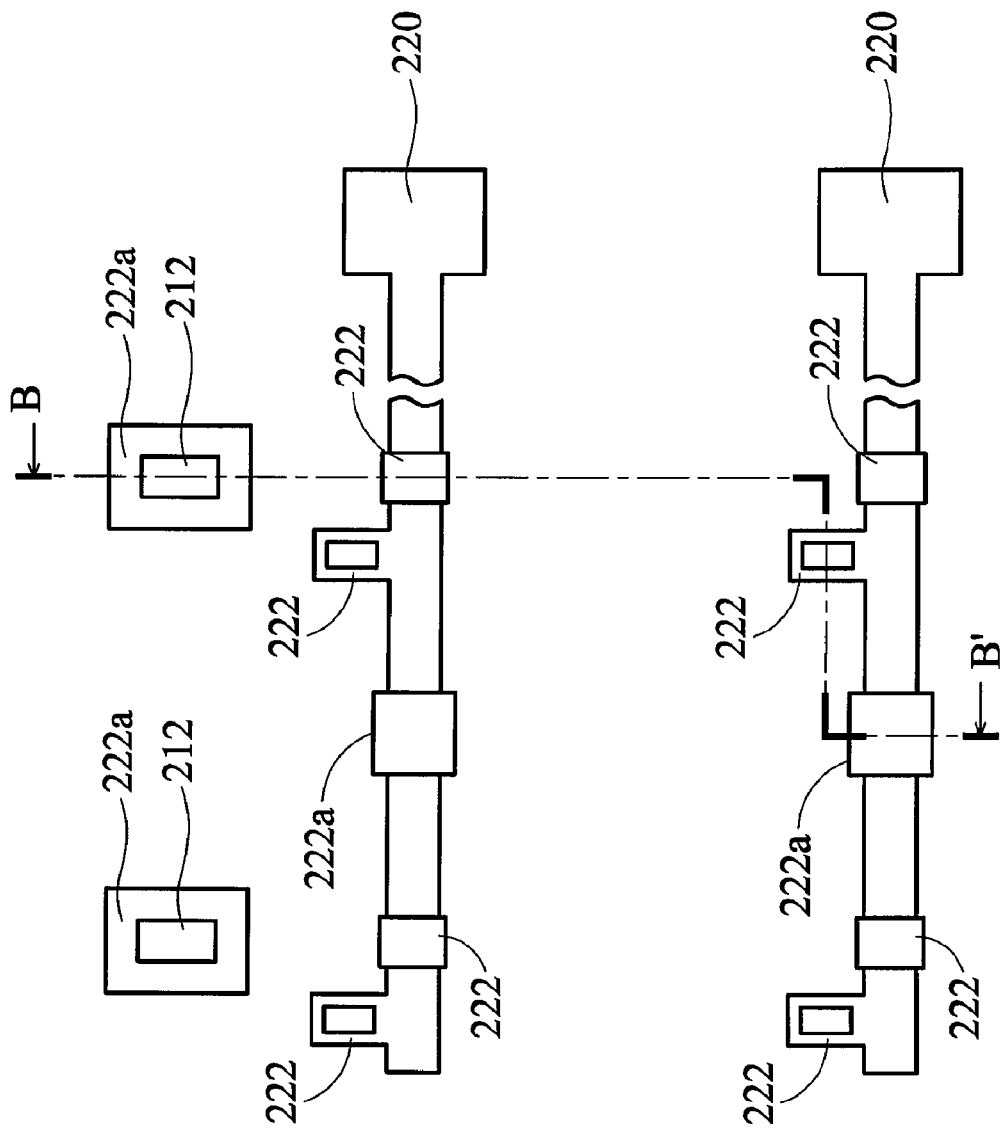
Figure 2D:
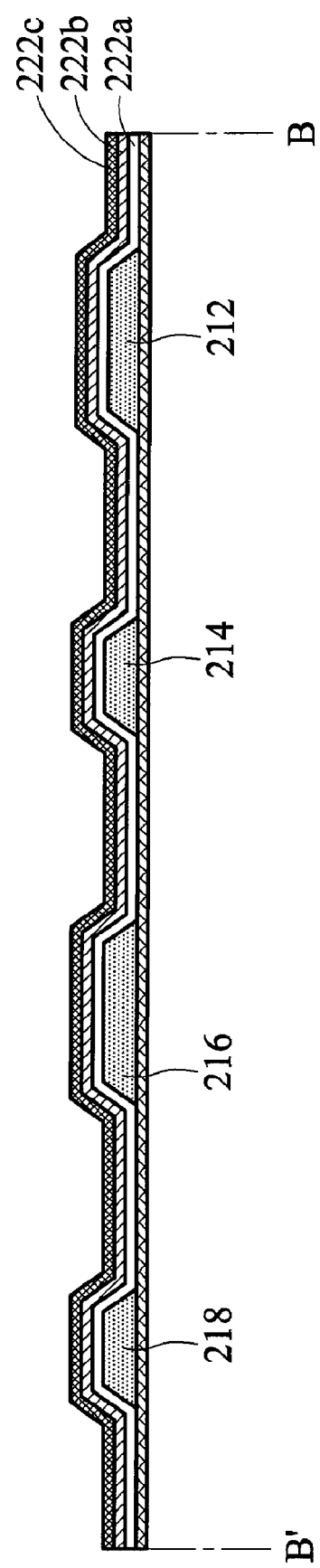
Figure 2E:
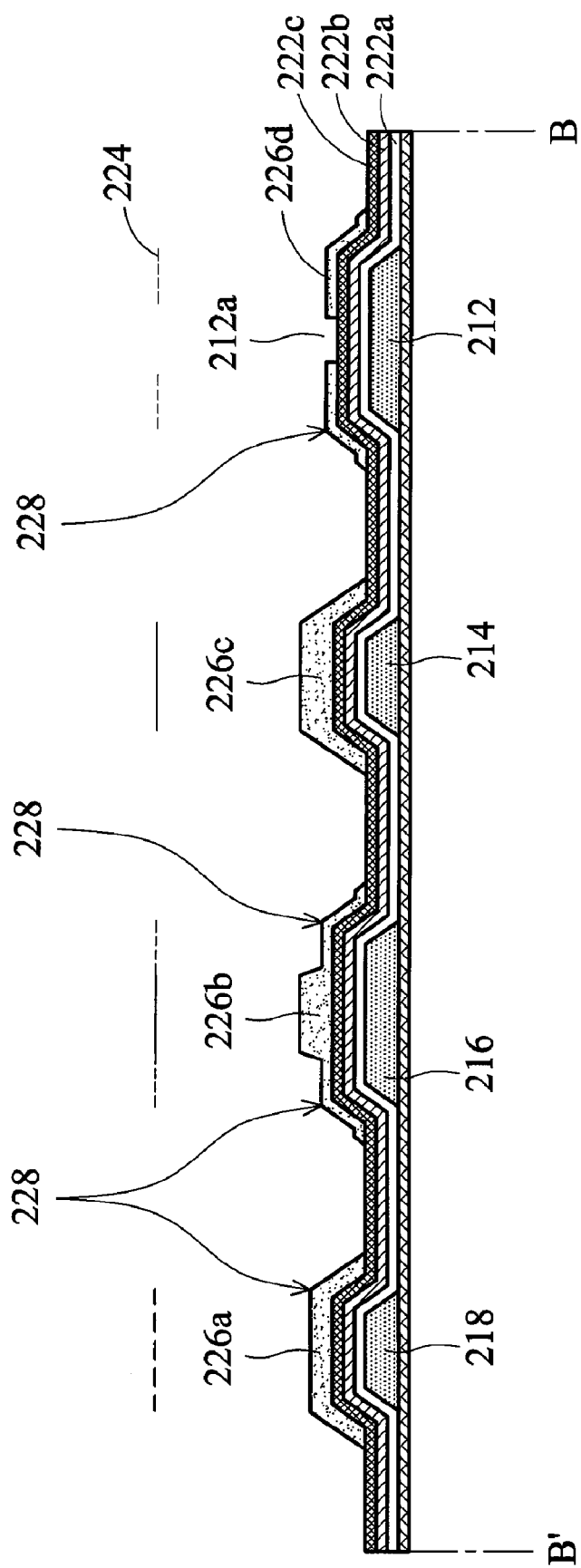
Figure 2F:
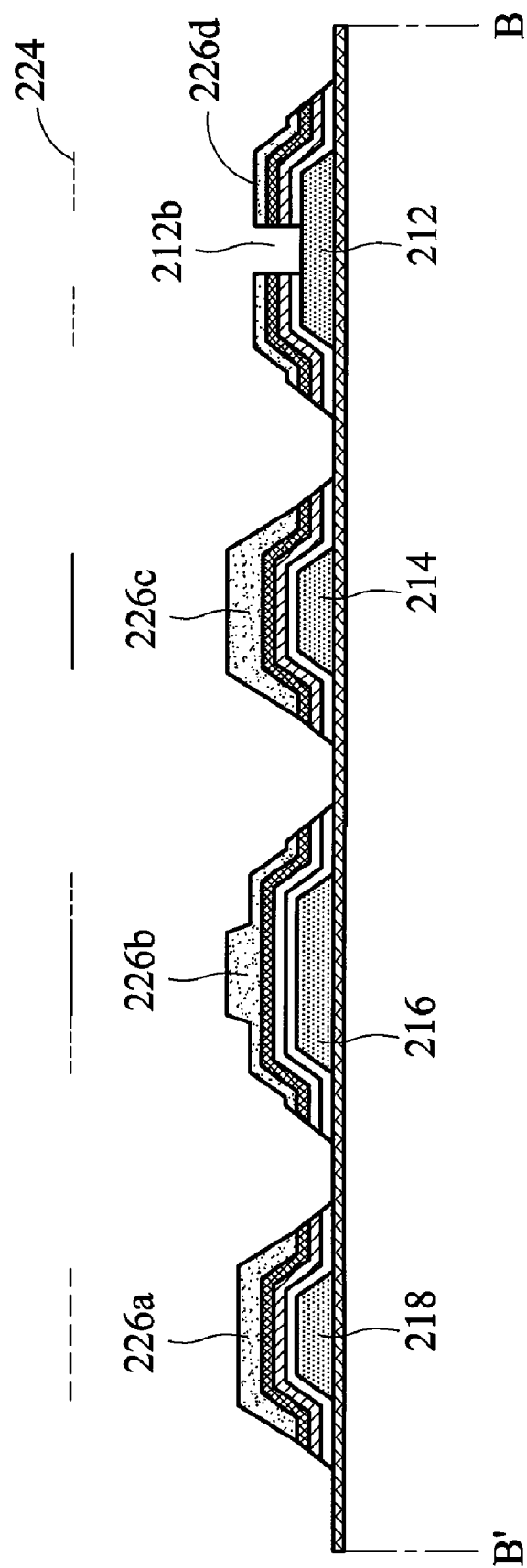
Figure 2G:
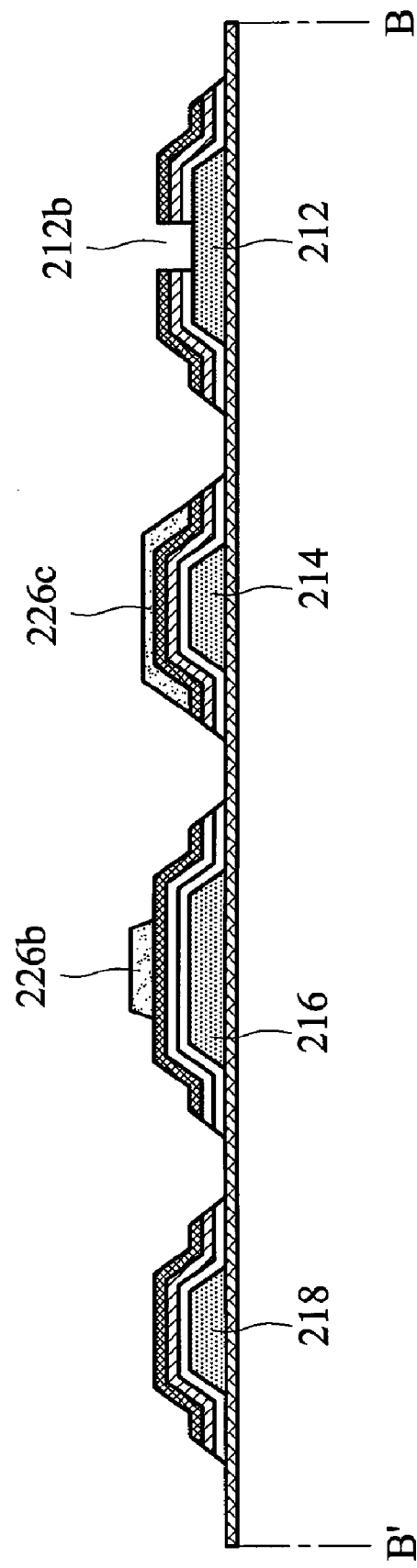
Figure 2H:
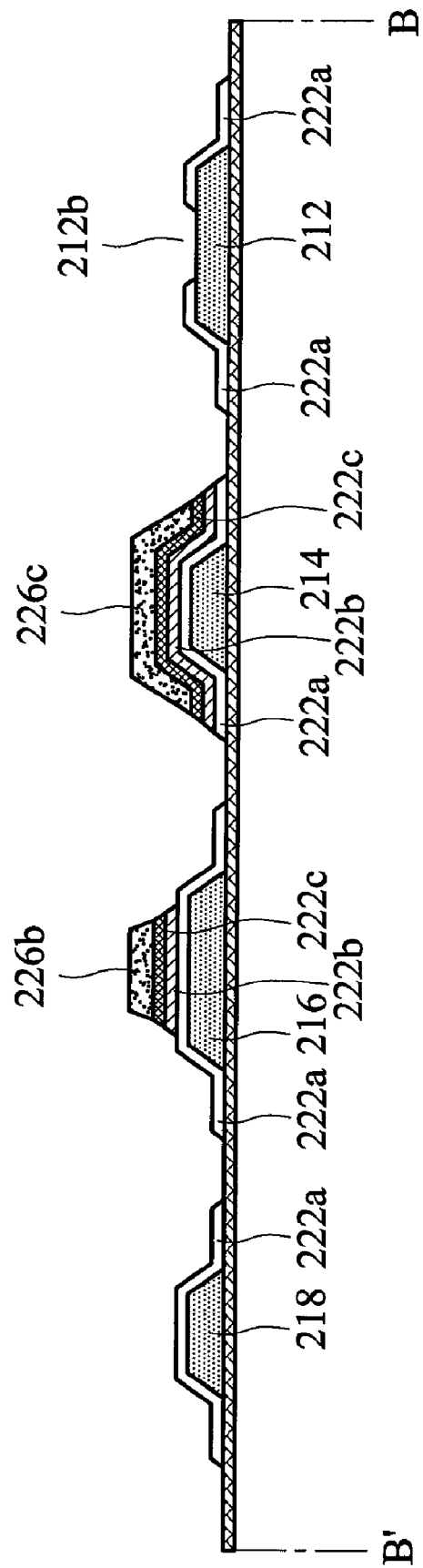
Figure 2I:
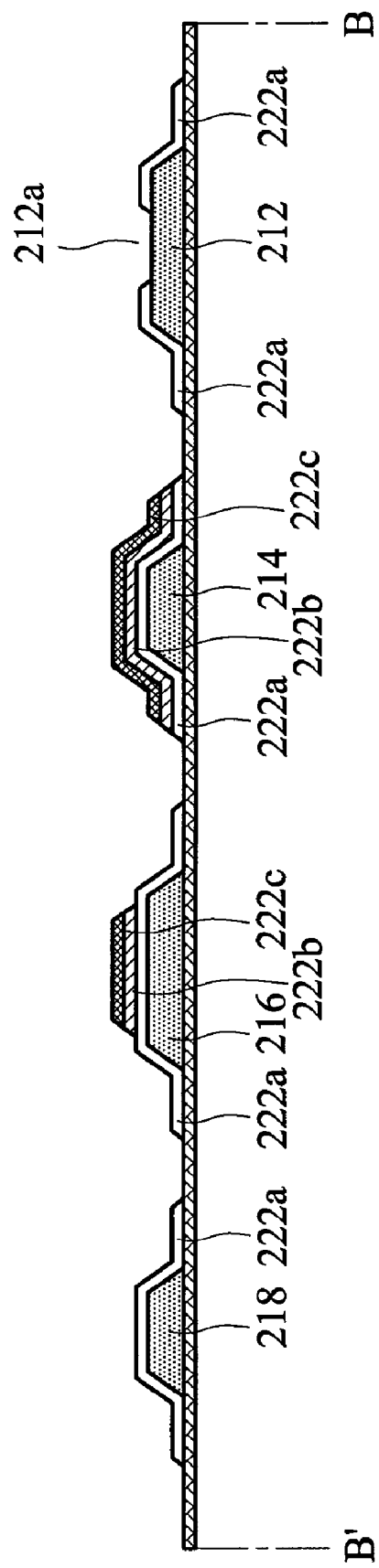
Figure 2J:
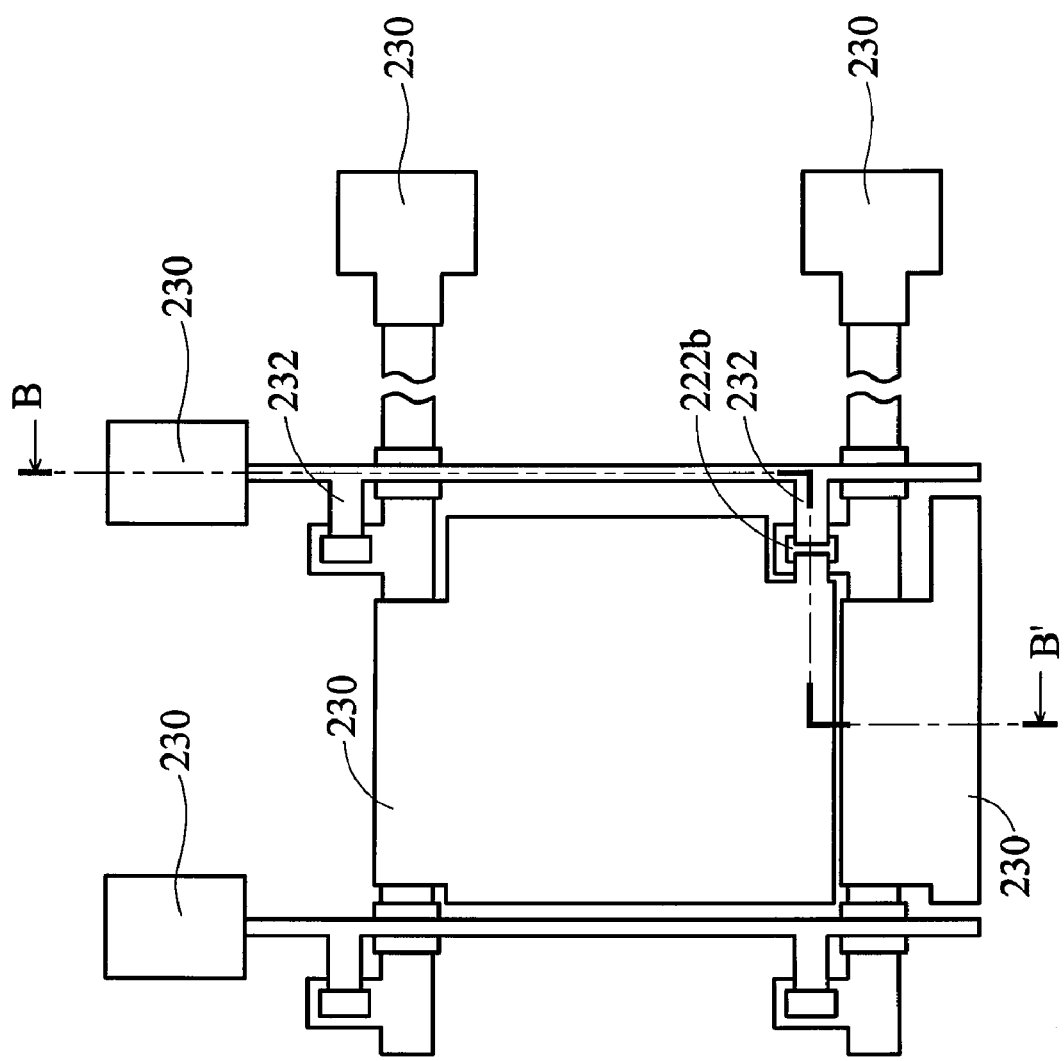
Figure 2K:
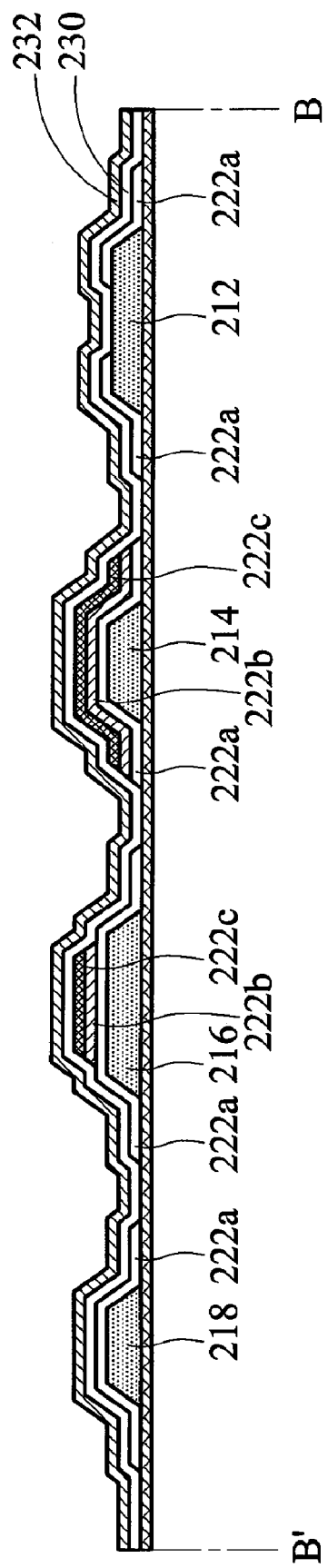
Figure 2L:
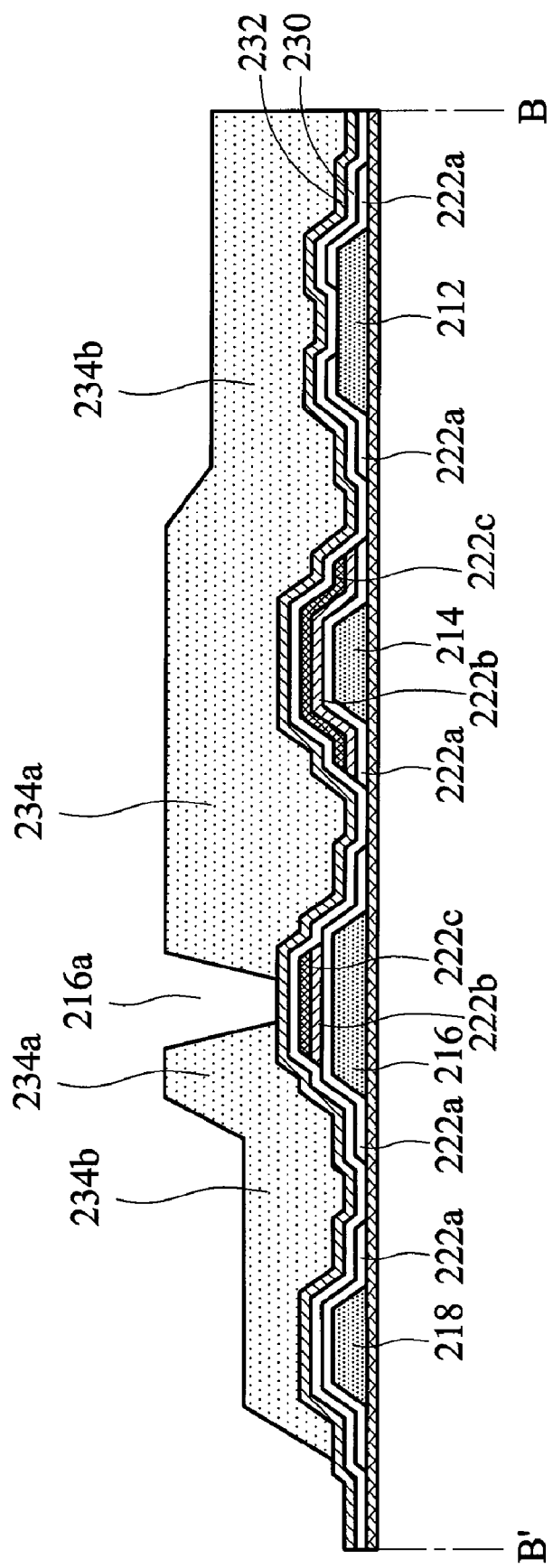
Figure 2M:
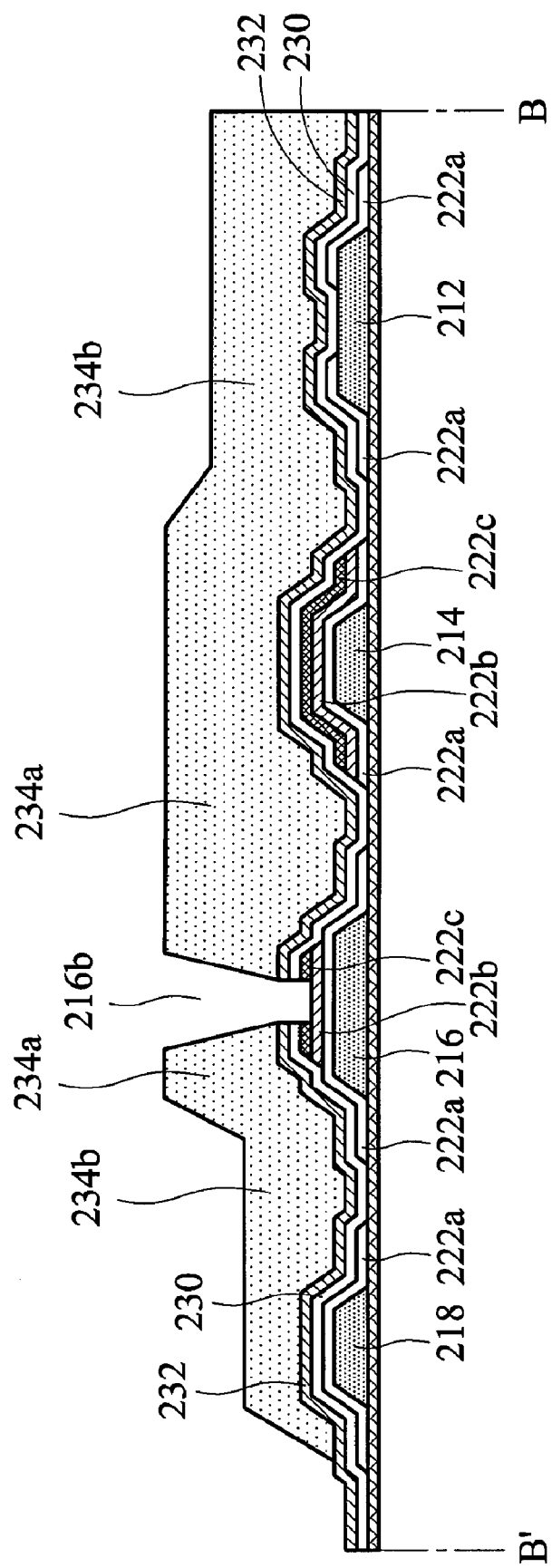
Figure 2N:
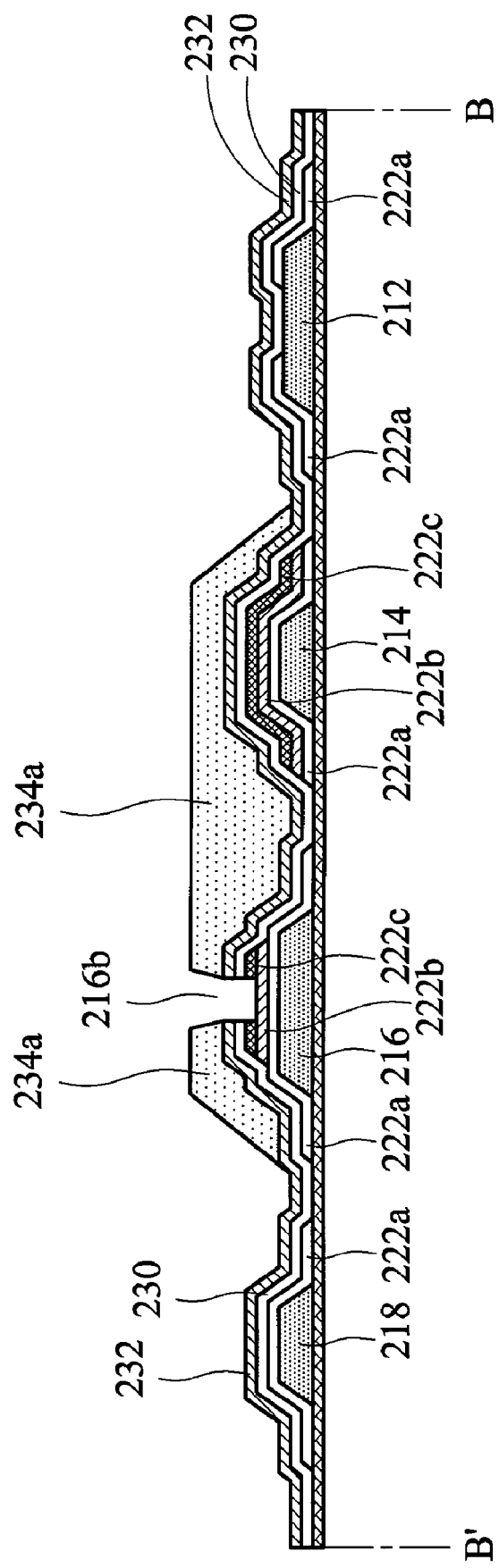
Figure 2O:
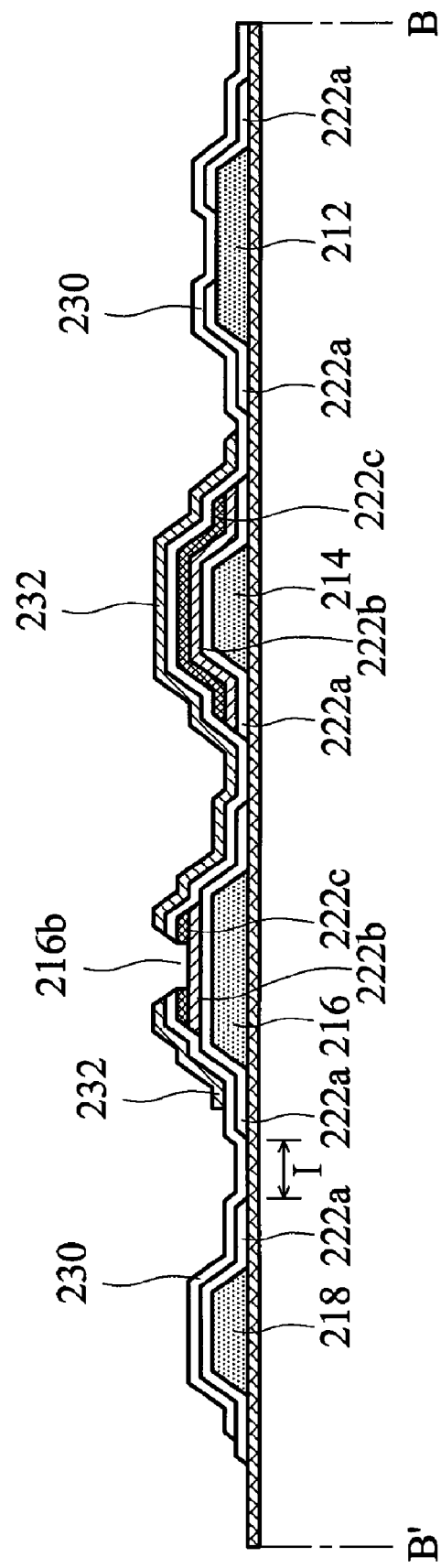
Figure 2P:
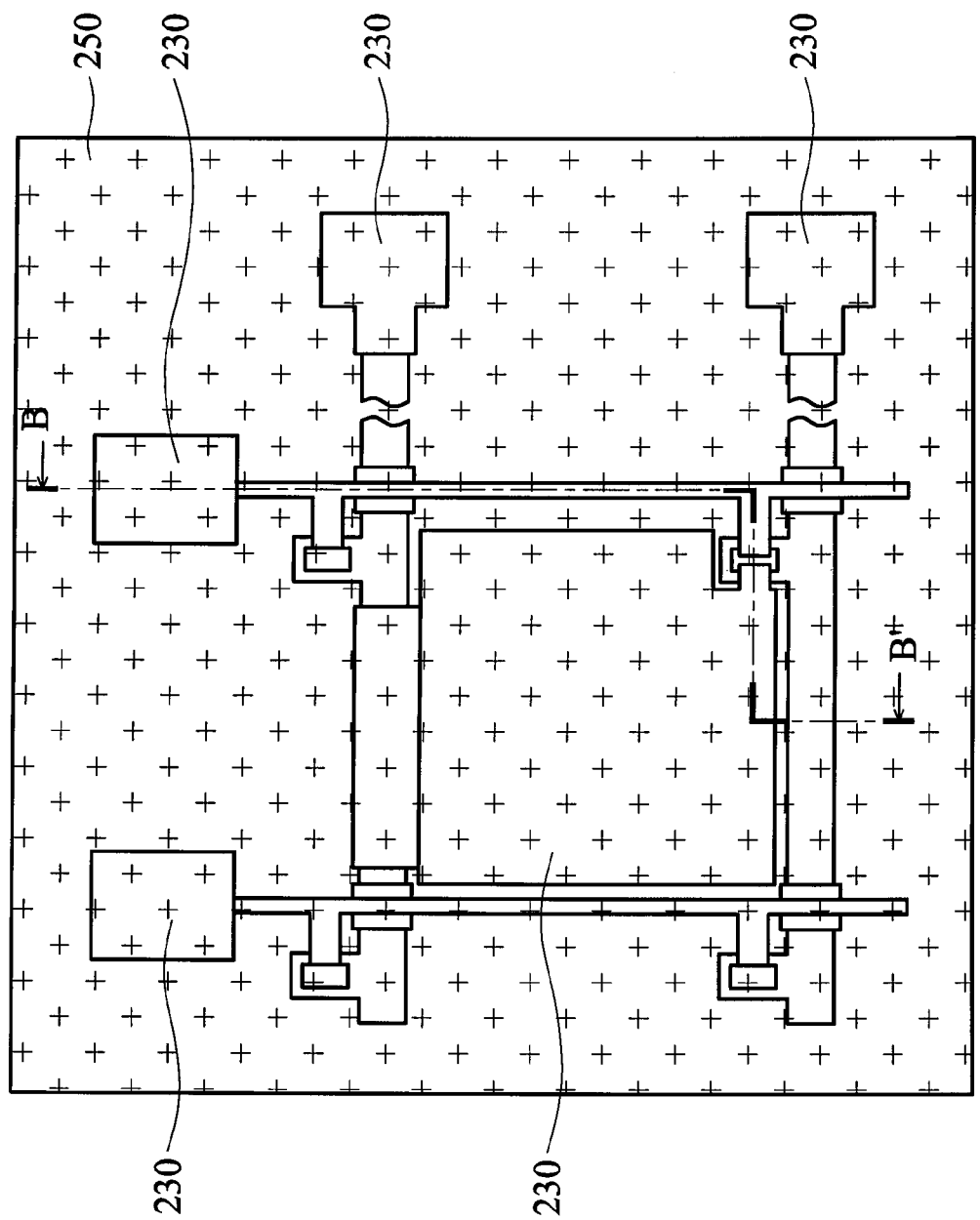
Figure 2Q:
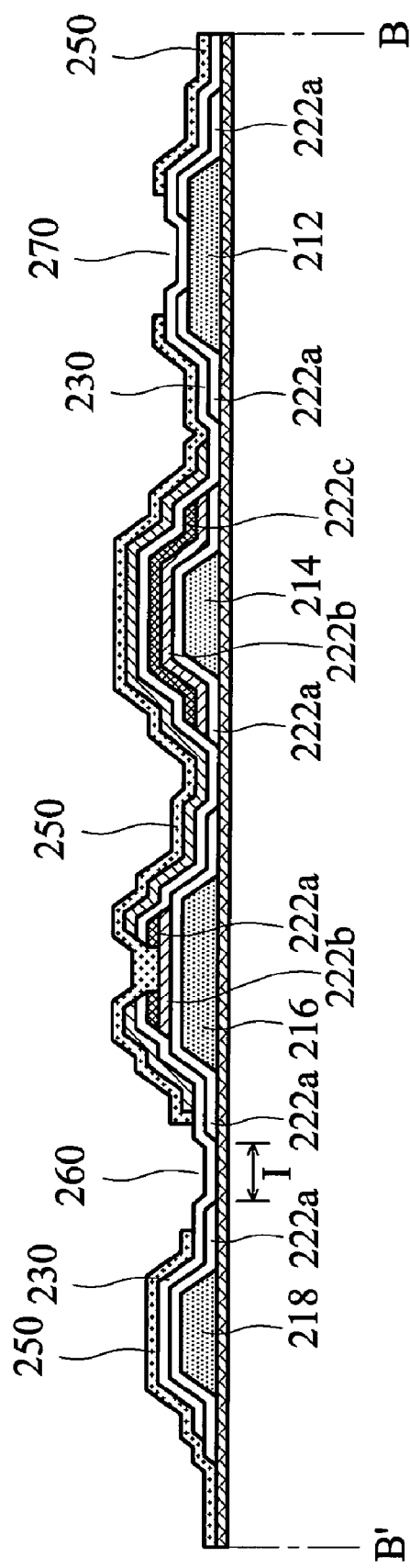

FIGS. 2A-2Q illustrate the second embodiment of a fabrication method of a thin film transistor (TFT) array substrate. FIG. 2A shows a plan view of a structure formed by a first mask process and FIG. 2B shows a cross section of FIG. 2A along cross section line BB'. As shown in FIGS. 2A and 2B, a conductive layer (not shown) is formed overlying a substrate (not shown), and is subjected to a first mask process to form a conductive pattern. The conductive pattern includes a lower electrode 218 of a capacitor, a gate 216, a gate line 214, a data line contact pad 212, and a gate line contact pad 220. Materials of the conductive pattern include metal such as Cu, Al, Mo, Ti, or Cr. Formation of the conductive pattern is well known, thus, it is omitted here for brevity. The lower electrode 218 of the capacitor is a part of the gate line 214, and the gate electrode 216 extends from the gate line 214.

FIG. 2C shows a plan view of a structure formed by a second mask process. FIG. 2I shows a cross section of FIG. 2C along cross section line BB' and FIGS. 2D-2H show cross sections of a second mask process. As shown in FIG. 2D, a stack (e.g. including the gate dielectric layer 222a, the semiconductor layer 222b and the ohmic contact layer 222c) is formed overlying the lower electrode 218 of the capacitor, gate 216, gate line 214, data line contact pad 212, and gate line contact pad 220. As shown in FIG. 2E, a photo-resist layer is formed overlying the stack first (not shown), and a third mask process using a half-tone mask pattern 224 is then performed to form photo-resist patterns 226a, 226b, 226c, 226d, and an opening 212a for exposing a portion of the ohmic contact layer 222c. The numeral 228 refers to half-tone areas. The photo-resist patterns 226b, 226c are thicker than the photo-resist patterns 226a, 226d. Specifically, the photo-resist patterns 226b, 226c have thicknesses at least 1.5 times those of the photo-resist patterns 226a, 226d, for example.

As shown in FIG. 2F, with the photo-resist patterns 226a, 226b, 226c, 226d serving as masks, the stack uncovered by the photo-resist patterns is etched and removed fully, so that an opening 212b exposing a portion of the data line contact pad 212 is formed. As shown in FIG. 2G, the photo-resist patterns 226a, 226b, 226c, 226d are next etched until full removal of the photo-resist patterns 226a and 226d. Since the photo-resist patterns 226b and 226c are thicker than the photo-resist patterns 226a and 226d, portions of the photo-resist patterns 226b and 226c remain overlying the gate electrode 216 and the gate line 214. As shown in FIG. 2H, with the remaining portions of the photo-resist patterns 226b and 226c over the gate electrode 216 and the gate line 214 serving as masks, the semiconductor layer 222b and ohmic contact layer 222c uncovered by the photo-resist patterns are etched and removed completely. As shown in FIG. 2I, the remaining portions of the photo-resist patterns 226b and 226c over the gate electrode 216 and the gate line 214 are then stripped. Materials of the semiconductor layer 222b can be amorphous silicon or polysilicon. Materials of the gate dielectric layer 222a includes silicon nitride, silicon oxide or silicon oxynitride. Since materials and formation of the stack are well known, the descriptions are omitted here for brevity. It is noted that the gate dielectric layer 222a overlying the gate electrode 216 extends to the surface of the substrate, i.e. fully covering the gate electrode 216. In addition, the semiconductor layer 222b and the ohmic contact layer 222c, for example, both have thicknesses less than that of the gate electrode 216.

FIG. 2J shows a plan view of a structure formed by a third mask process. FIG. 2O shows a cross section of FIG. 2J along cross section line BB'. As shown in FIG. 2K, a transparent conductive layer 230 and a metal layer 232 are formed in sequence overlying the substrate and the patterned stack. The transparent conductive 230 can be an indium tin oxide layer, or an indium zinc oxide layer and the metal layer 232 can be Cu, Al, Mo, Ti, or Cr, and formation thereof is omitted here from brevity since it is well known to those with ordinary skill in the art. A photo-resist layer (not shown) is then formed overlying the metal layer 232. As shown in FIG. 2L, a third mask process employing a half-tone mask pattern (not shown) is next performed, resulting in formation of a photo-resist pattern 234a, a photo-resist pattern 234b and an opening 216a. The photo-resist pattern 234a is thicker than the photo-resist pattern 234b. Specifically, the photo-resist pattern 234a has a thickness which is at least 1.5 times that of the photo-resist pattern 234b, for example.

As shown in FIG. 2M, the transparent conductive layer 230, the metal layer 232 and the ohmic contact layer 222c underlying the opening 216a is next etched with the photo-resist pattern 234a and the photo-resist pattern 234b serving as masks, while forming an opening 216b. The opening 216b exposes a portion of the semiconductor layer 222b overlying the gate electrode 216. As shown in FIG. 2N, the photo-resist pattern 234a and the photo-resist pattern 234b are then etched until complete removal of the photo-resist pattern 234b. Since the photo-resist pattern 234a is thicker than the photo-resist pattern 234b, a portion of the photo-resist pattern 234a remains overlying the gate electrode 216 and the gate line 214.

As shown in FIG. 2O, with the remaining photo-resist pattern 234a over the gate electrode 216 and the gate line 214 serving as a mask, the metal layer 232 overlying the lower electrode 218 of the capacitor, the data contact pad 212 and the pixel area I are removed. Next, the photo-resist pattern 234a overlying the gate electrode 216 and the gate line 214 is stripped. As described, after the third mask process, the remaining metal layer 232 serves as a data line perpendicular to the gate line 214, and source and drain regions (also source and drain electrodes) are isolated by the opening 216b, respectively. Additionally, the remaining transparent conductive layer 230 serves as a pixel electrode overlying the pixel area I, an upper electrode of the capacitor overly the lower electrode 218 of the capacitor, and a contact pad electrode overly the data line contact pad 212. Meanwhile, the drain region is electrically connected to the pixel electrode, the source region is electrically connected to the data line, and the upper electrode of the capacitor is electrically connected to the pixel electrode.

FIG. 2P shows a plan view of a structure formed by a laser ablation process. FIG. 2Q shows a cross section of FIG. 2P along cross section line BB'. As shown in FIGS. 2P and 2Q, a passivation layer 250 is formed to cover the overall substrate. As shown in FIG. 2Q, a laser ablation process is then used to pattern the passivation layer 250, thus, forming openings 260 and 270 for exposing a portion of transparent conductive layer 230. The laser ablation used in this embodiment is similar to that in first embodiment. The passivation layer 250 includes silicon nitride, silicon oxide or silicon oxynitride, or organic material containing dielectric layers.

According to the methods of these embodiments of the invention, at least one photolithography and etching process can be eliminated due to the use of the laser ablation process, thus, enhancing the throughput and saving the manufacturing costs.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fabrication method of a thin film transistor (TFT) array substrate, comprising:
    forming a first conductive layer on a substrate;
    performing a first mask process to pattern the first conductive layer, thereby forming a contact pad, a gate line, a gate electrode and a lower electrode of a capacitor;
    forming a stack covering the substrate, the contact pad, the gate line, the gate electrode and the lower electrode of the capacitor, wherein the stack includes a gate dielectric layer, a semiconductor layer and an ohmic contact layer;
    performing a second mask process to pattern the stack, thereby exposing the substrate and forming a first opening exposing the contact pad;
    forming a first transparent conductive layer covering the substrate, the stack and the exposed contact pad;
    forming a second conductive layer covering the first transparent conductive layer;
    performing a third mask process to form a data line perpendicular to the gate line, source and drain regions overlying the gate electrode, a pixel electrode in a pixel area of the substrate, an upper electrode of the capacitor overlying the lower electrode of the capacitor, a contact pad electrode overlying the contact pad, and a second opening exposing the semiconductor layer and separating the source and drain regions, wherein the drain region is electrically connected to the pixel electrode, the source region is electrically connected to the data line, and the upper electrode of the capacitor is electrically connected to the pixel electrode,
    wherein the third mask process comprises:
        forming a photo-resist layer overlying the second conductive layer;
        patterning the photo-resist layer using a half-tone mask, thereby forming a first photo-resist pattern overlying the pixel area, the lower electrode of the capacitor and the contact pad of the substrate, and forming a second photo-resist pattern overlying the gate electrode and a predetermined region whereby a data is to be formed, wherein the second photo-resist pattern has a thickness larger than that of the first photo-resist pattern, and has a fifth opening overlying the gate electrode that exposes the second conductive layer;
        removing the second conductive layer, the transparent conductive layers and the ohmic contact layer within the fifth opening, thereby forming the second opening exposing the semiconductor layer;
        removing the first photo-resist pattern and a portion of the second photo-resist pattern; and
        removing the second conductive layer overlying the contact pad, the pixel area and the lower electrode of the capacitor with the residual portion of the second photo-resist pattern serving as a mask;
    forming a passivation layer covering the overall substrate; and
    performing a laser ablation process to pattern the passivation layer, thereby forming third and fourth openings exposing a portion of the first transparent conductive layer.

2. The fabrication method as claimed in claim 1, wherein the laser ablation process comprises:
    removing a portion of the passivation layer overlying the pixel electrode and the contact pad electrode via direct passing of a laser beam through a mask pattern.

3. The fabrication method as claimed in claim 1, wherein the laser ablation process comprises:
    forming a photo-resist pattern serving as a mask overlying the passivation layer, and exposing the contact pad electrode and a portion of the passivation layer overlying the pixel electrode;

removing the contact pad electrode and a portion of the passivation layer overlying the pixel electrode by a laser beam; and removing the photo-resist pattern.

4. The fabrication method as claimed in claim 1, wherein the second photo-resist pattern has a thickness which is at least 1.5 times that of the photo-resist pattern.

5. The fabrication method as claimed in claim 1, wherein the gate electrode extends from the gate line.

6. The fabrication method as claimed in claim 1, wherein the first or second conductive layer includes a metal material.

7. The fabrication method as claimed in claim 6, wherein the metal material includes Cu, Al, Mo, Ti, or Cr.

8. The fabrication method as claimed in claim 1, wherein the semiconductor layer includes amorphous silicon or poly-silicon.

9. The fabrication method as claimed in claim 1, wherein the gate dielectric layer includes silicon nitride, silicon oxide or silicon oxynitride.

10. The fabrication method as claimed in claim 1, wherein the passivation layer includes silicon nitride, silicon oxide or silicon oxynitride, or organic material containing dielectric layers.

11. A fabrication method of a thin film transistor (TFT) array substrate, comprising:

forming a first conductive layer on a substrate;

performing a first mask process to pattern the first conductive layer, thereby forming a contact pad, a gate line, a gate electrode and a lower electrode of a capacitor;

forming a stack covering the substrate, the contact pad, the gate line, the gate electrode and the lower electrode of the capacitor, wherein the stack includes a gate dielectric layer, a semiconductor layer and an ohmic contact layer;

performing a second mask process to pattern the stack, thereby exposing the substrate and forming a first opening exposing the contact pad;

forming a first transparent conductive layer covering the substrate, the stack and the exposed contact pad;

forming a second conductive layer covering the first transparent conductive layer;

performing a third mask process to form a data line perpendicular to the gate line, source and drain regions overlying the gate electrode, a pixel electrode in a pixel area of the substrate, an upper electrode of the capacitor overlying the lower electrode of the capacitor, a contact pad electrode overlying the contact pad, and a second opening exposing the semiconductor layer and separating the source and drain regions, wherein the drain region is electrically connected to the pixel electrode, the source region is electrically connected to the data line, and the upper electrode of the capacitor is electrically connected to the pixel electrode;

forming a passivation layer covering the overall substrate; and performing a laser ablation process to pattern the passivation layer, thereby forming third and fourth openings exposing a portion of the first transparent conductive layer, wherein the laser ablation process comprises removing a portion of the passivation layer overlying the pixel electrode and the contact pad electrode via direct passing of a laser beam through a mask pattern.

12. A fabrication method of a thin film transistor (TFT) array substrate, comprising:

forming a first conductive layer on a substrate;

performing a first mask process to pattern the first conductive layer, thereby forming a contact pad, a gate line, a gate electrode and a lower electrode of a capacitor;

forming a stack covering the substrate, the contact pad, the gate line, the gate electrode and the lower electrode of the capacitor, wherein the stack includes a gate dielectric layer, a semiconductor layer and an ohmic contact layer;

performing a second mask process to pattern the stack, thereby exposing the substrate and forming a first opening exposing the contact pad;

forming a first transparent conductive layer covering the substrate, the stack and the exposed contact pad;

forming a second conductive layer covering the first transparent conductive layer;

performing a third mask process to form a data line perpendicular to the gate line, source and drain regions overlying the gate electrode, a pixel electrode in a pixel area of the substrate, an upper electrode of the capacitor overlying the lower electrode of the capacitor, a contact pad electrode overlying the contact pad, and a second opening exposing the semiconductor layer and separating the source and drain regions, wherein the drain region is electrically connected to the pixel electrode, the source region is electrically connected to the data line, and the upper electrode of the capacitor is electrically connected to the pixel electrode;

forming a passivation layer covering the overall substrate; and performing a laser ablation process to pattern the passivation layer, thereby forming third and fourth openings exposing a portion of the first transparent conductive layer, wherein the laser ablation process comprises:

forming a photo-resist pattern serving as a mask overlying the passivation layer, and exposing the contact pad electrode and a portion of the passivation layer overlying the pixel electrode;

removing the contact pad electrode and a portion of the passivation layer overlying the pixel electrode by a laser beam; and removing the photo-resist pattern.

* * * * *